(12) United States Patent
Mattes et al.

(10) Patent No.: US 6,793,830 B2
(45) Date of Patent: Sep. 21, 2004

(54) METHOD FOR FORMING A MICROSTRUCTURE FROM A MONOCRYSTALLINE SUBSTRATE

(75) Inventors: Michael F. Mattes, Chandler, AZ (US); Ralph B. Danzl, Tempe, AZ (US)

(73) Assignee: Medtronic, Inc., Minneapolis, MN (US)

( * ) Notice: Subject to any disclaimer, the term of this patent is extended or adjusted under 35 U.S.C. 154(b) by 174 days.

(21) Appl. No.: 10/256,395

(22) Filed: Sep. 27, 2002

(65) Prior Publication Data

US 2004/0060897 A1 Apr. 1, 2004

(51) Int. Cl.$^7$ .................................................. B81C 1/00
(52) U.S. Cl. ........................... 216/2; 216/36; 216/51; 438/55; 438/690
(58) Field of Search ........................... 216/2, 36, 51, 216/79; 438/55, 690

(56) References Cited

U.S. PATENT DOCUMENTS

| | | | |
|---|---|---|---|
| 4,996,082 A | | 2/1991 | Guckel et al. |
| 5,332,469 A | * | 7/1994 | Mastrangelo .................. 216/2 |
| 5,374,564 A | | 12/1994 | Bruel |
| 5,397,904 A | * | 3/1995 | Arney et al. .................. 257/66 |
| 5,441,597 A | | 8/1995 | Bonne et al. |
| 6,001,666 A | * | 12/1999 | Diem et al. .................... 438/52 |
| 6,433,401 B1 | * | 8/2002 | Clark et al. .................. 257/524 |
| 6,613,678 B1 | * | 9/2003 | Sakaguchi et al. .......... 438/695 |

OTHER PUBLICATIONS

Excerpts from a book entitled "Fundamentals Of Microfabrication", Marc Madou, 1997, p231–239, 243–244, 249–250.

"A 'Smarter–Cut' Approach to Low Temperature Silicon Layer Transfer," *Appl. Phys. Lett.* vol. 72, No. 1, p49, Tong et al (Jan. 1998).

"A Lower Bound On Implant Density To Induce Wafer Splitting In Forming Compliant Substrate Structures," *Appl. Phys. Lett.*, vol. 70, No. 26, p. 3519, L. B. Fruend (Jun. 1997).

"The History, Physics, and Applications of the Smart–Cut Process," MRS Bulletin, M. Bruel, p. 35 (Dec. 1998).

* cited by examiner

*Primary Examiner*—Allan Olsen
(74) *Attorney, Agent, or Firm*—Michael C. Soldner; Girma Wolde-Michael

(57) ABSTRACT

A method for forming a microstructure from a substrate is provided. The method includes providing a monocrystalline substrate having a (100) orientation and subjecting a first portion of the substrate to ion bombardment to effect ion implantation to a desired penetration depth. A second portion of the substrate is etched to a depth at least as great as the desired penetration depth. The substrate then is thermally treated to form a microstructure at a surface of the substrate and to effect at least partial separation between the microstructure and the substrate.

19 Claims, 6 Drawing Sheets

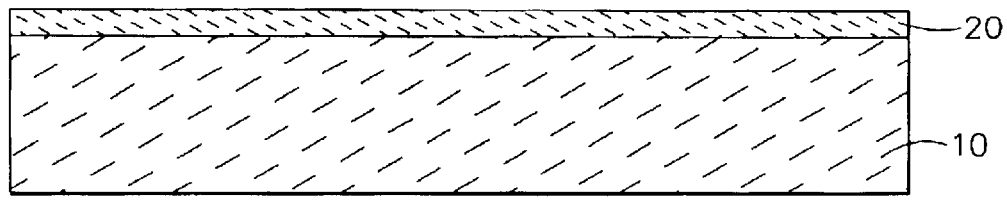
FIG. 1
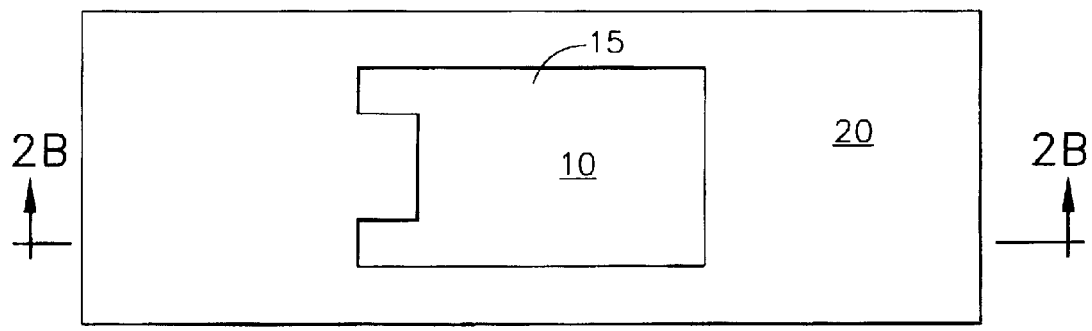
FIG. 2A
FIG. 2B
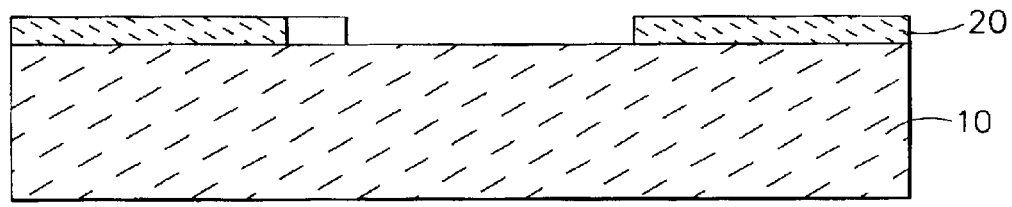
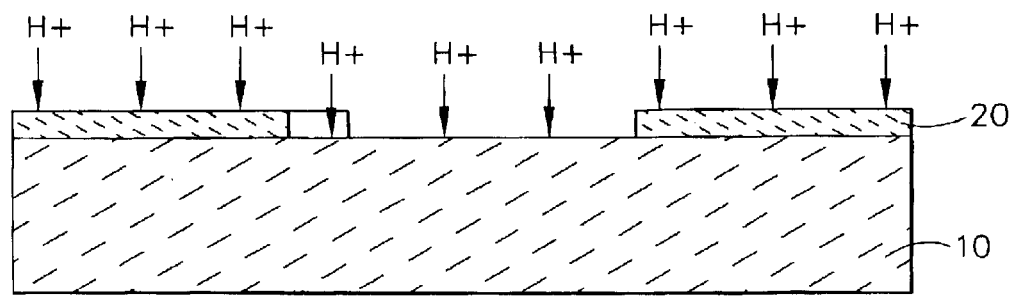
FIG. 3

METHOD FOR FORMING A MICROSTRUCTURE FROM A MONOCRYSTALLINE SUBSTRATE

FIELD OF THE INVENTION

This invention relates generally to a method for forming microstructures from a substrate and more specifically to a method for forming microstructures from a substrate using ion implantation.

BACKGROUND OF THE INVENTION

Semiconductor devices continue to shrink in size while growing exponentially in function. One class of small-scale semiconductor devices is microelectromechanical systems (MEMS), which are gaining ever-growing popularity in the microelectronics industry. MEMS are semiconductor device systems that include one or more microstructures, that is, structures of the size on the order of sub-$\mu$m to millimeters. MEMS devices include, without limitation, microhinges, microgears, micro-accelerometers, microbeams, microvalves, proof masses, switching cells, and microsensors. Such devices have found applications in optical systems, inkjet printers, telecommunications systems, medical devices, computer disk drives, and fluid measurement devices, to name just a few technologies.

MEMS systems typically are fabricated using surface micromachining technology that includes a number of intricate, and often costly, processing and fabrication steps that are conducted on a very small, microscopic scale. Surface micromachining technology often involves the formation of microstructures overlying materials with crystal structures different from those of the microstructures. Such processing may result in microstructures that are inherently stressed and that are undesirably bent or flexed in the MEMS devices. In addition, typical surface micromachining technology often requires the use of lateral etching for long processing times, which may result in slower throughput and higher production costs. Such etching also requires the need for selective etchants and often requires exposure to dangerous chemicals, such as hydrofluoric acid. Further, surface micromachining technology may result in microstructures formed of materials susceptible to stiction, a phenomenon induced by trapped liquids that causes a microstructure to attach to a substrate during final rinsing and drying steps.

Accordingly, a need exists for a method for forming microstructures from a substrate. In addition, a need exists for forming microstructures from a substrate using ion implantation.

SUMMARY OF THE INVENTION

This summary of the invention section is intended to introduce the reader to aspects of the invention and may not be a complete description of the invention. Particular aspects of the invention are pointed out in other sections herein below, and the invention is set forth in the appended claims which alone demarcate its scope.

In accordance with an exemplary embodiment of the present invention, a method for forming a microstructure from a substrate is provided. The method includes providing a monocrystalline substrate having a (100) orientation and subjecting a first portion of the substrate to ion bombardment to effect ion implantation to a desired penetration depth. A second portion of the substrate is etched to a depth at least as great as the desired penetration depth. The substrate is thermally treated to form a microstructure at a surface of the substrate and to effect at least partial separation between the microstructure and the substrate.

In another exemplary embodiment of the present invention, a method for micromachining a monocrystalline structure from the surface of a substrate is provided. The method includes providing a monocrystalline substrate having a (100) orientation and forming a first patterned hard mask on the substrate to expose a first portion of the substrate. The first portion of the substrate is subjected to ion bombardment to effect ion implantation to a desired penetration depth and the first patterned hard mask is removed. A second patterned hard mask is formed on the substrate to expose a second portion of the substrate. The second portion of the substrate is etched to a depth at least as great as the desired penetration depth. The substrate is thermally treated to form a microstructure at a surface of the substrate and to effect at least partial separation between the microstructure and the substrate.

BRIEF DESCRIPTION OF THE DRAWINGS

The present invention is illustrated by way of example and not limitation in the accompanying figures, in which like references indicate similar elements, and in which:

FIGS. 1–7 illustrate schematically, in cross section, the formation of a released microstructure in accordance with an exemplary embodiment of the invention;

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE INVENTION

The following description is of exemplary embodiments only and is not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

FIGS. 1–7 illustrate a process in accordance with one exemplary embodiment of the invention for forming a released microstructure from a substrate using ion implantation. Referring to FIG. 1, the process starts by providing a monocrystalline semiconductor substrate 10 having a (100) orientation. In this context, the term "monocrystalline" shall have the meaning commonly used within the semiconductor industry and shall refer to materials that are a single crystal or that are substantially a single crystal, such as silicon or germanium or mixtures of silicon and germanium. Substrate 10 may be either n-type or p-type. A first hard mask 20 is deposited overlying substrate 10 using standard techniques known in the semiconductor industry. First hard mask 20 may comprise a silicon dioxide film, a silicon nitride film, a metal film, or any other material that is substantially impervious to ion implantation. In a preferred embodiment of the invention, first hard mask 20 comprises silicon dioxide. Referring to FIGS. 2A and 2B, hard mask 20 is then patterned using standard semiconductor photolithography techniques to expose a first portion 15 of substrate 10.

Figure 4:
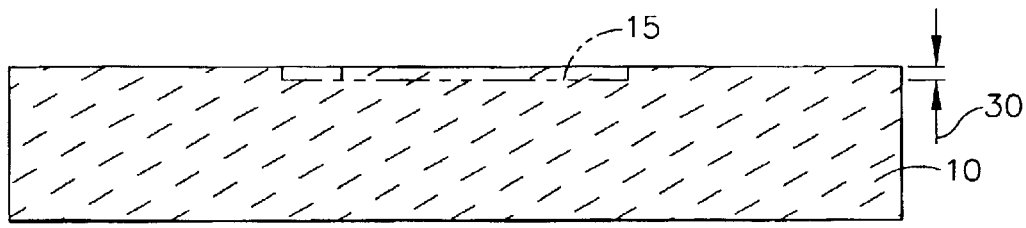

Referring to FIG. 3, substrate 10 then is subjected to an ion bombardment of H+ ions (protons) at a given dose and energy to achieve implantation to a desired penetration depth 30, as shown in FIG. 4. The penetration depth 30 may determine the thickness of the microstructure that is being fabricated by ion implantation or, alternatively, the thickness of a portion of the microstructure that is being fabricated by ion implantation. In one exemplary embodiment of the present invention, the implantation of the H+ ions may be conducted with a dose ranging from about $1 \cdot 10^{16}$ cm$^{-2}$ to about $7 \cdot 10^{16}$ cm$^{-2}$ and an energy ranging from about 40 keV to about 80 keV. In a preferred embodiment of the invention, ion implantation is performed with a dose of about $4 \cdot 10^{16}$ cm$^{-2}$ and an energy of about 80 keV. As illustrated in FIG. 4, first hard mask 20 is then removed.

Figure 5A:
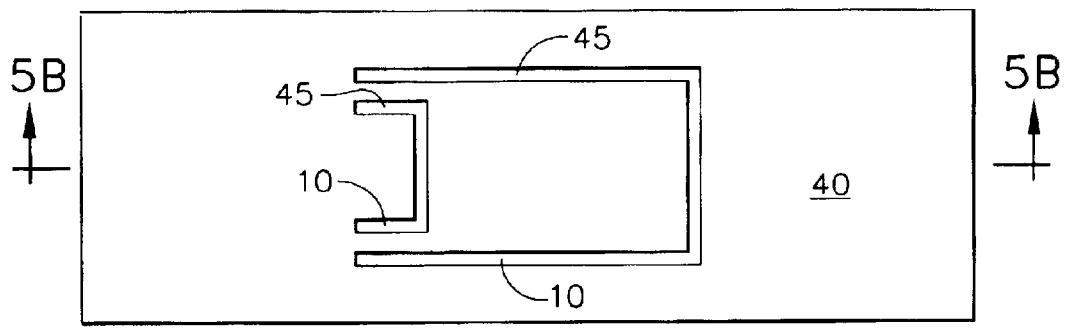
Figure 5B:
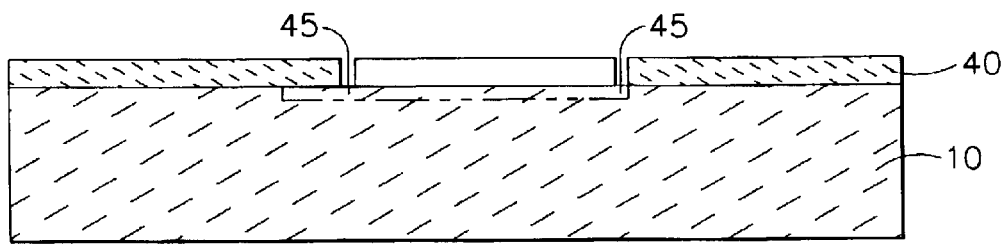
Figure 6:
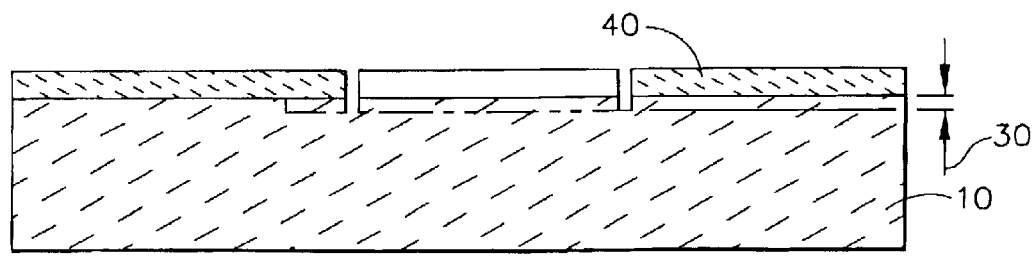

Referring to FIGS. 5A and 5B, a second hard mask 40 is deposited overlying substrate 10 and is patterned using standard semiconductor photolithography techniques to expose a second portion 45 of substrate 10 which has been subjected to ion implantation. In one exemplary embodiment of the present invention, second hard mask 40 may be patterned to expose substrate 10 about the edges of first portion 15 of substrate 10 exposed to ion implantation. Alternatively, second hard mask 40 may be patterned to expose an area of substrate 10 proximate to first portion 15 of substrate 10 subjected to ion bombardment so that subsequent etching serves to separate first portion 15 of substrate 10 subjected to ion bombardment from the remainder of substrate 10 at the side edges. In this manner, second hard mask 40 may be suitably patterned so that a released microstructure may be subsequently fabricated. Referring to FIG. 6, substrate 10 is then subjected to an etch to a depth of the substrate at least as great as desired penetration depth 30. The etch may be a wet etch, such as an etch in hydrofluoric acid or other similar fluid, a dry etch such as in a plasma, or any other etch known in the semiconductor industry suitable for etching substrate 10. Second hard mask 40 is then removed from substrate 10.

Figure 7:
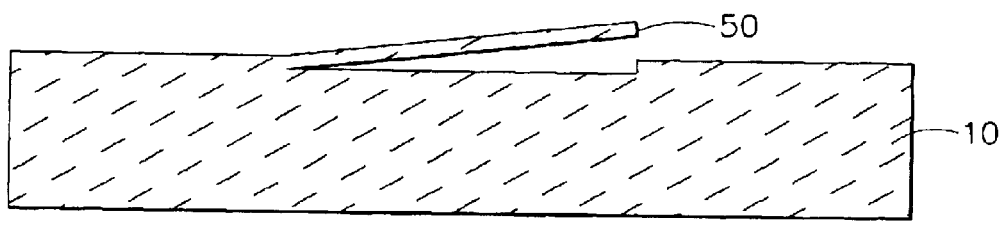
Figure 8:
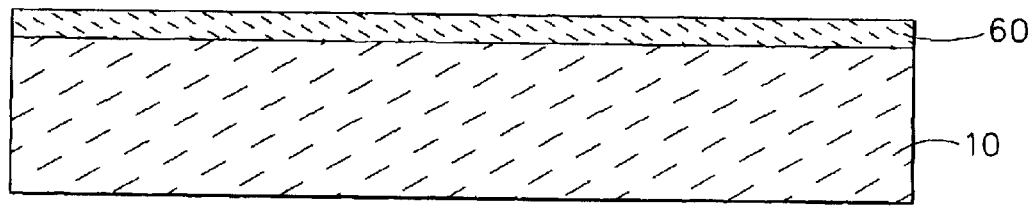
FIGS. 8–13 illustrate schematically, in cross section, the formation of a freed microstructure in accordance with another exemplary embodiment of the invention.

Referring to FIG. 7, substrate 10 is then thermally treated to induce a formed microstructure 50 to separate or cleave from substrate 10 at the penetration depth 30. In one exemplary embodiment of the invention, the substrate is subjected to a thermal anneal of about 400–600° C. for about 15 minutes to one hour in nitrogen gas. As may be appreciated, it is preferable to maintain the thermal anneal at temperatures and anneal times below those that will cause the hydrogen ions to diffuse and escape out of the substrate. In a preferred embodiment of the present invention, substrate 10 is subjected to a thermal anneal of about 500° C. for about 30 minutes in nitrogen gas. In an optional embodiment of the present invention, substrate 10 may be first subjected to a low temperature thermal anneal of about 200–300° C. for about 30 minutes to one hour in an ambient environment, followed by a thermal anneal of about 500° C. for about 30 minutes in nitrogen gas. Without being limited to any particular theory, it is believed that when hydrogen ions are implanted in a monocrystalline substrate having a (100) lattice at doses and energies within the ranges given above, the hydrogen ions start to form bubbles that are distributed about a plane at the penetration depth that is parallel to the substrate surface. Upon thermal treatment, the bubbles coalesce, inducing a relatively defect-free cleaving between the layer of substrate above the plane at the penetration depth and the remainder of the substrate. Such a process may produce microstructure 50, which has a single crystal lattice like the single crystal lattice of substrate 10.

While in the above embodiment, hard mask 40 is removed prior to thermal treatment, it will be appreciated that substrate 10 may be thermally treated before hard mask 40 is removed.

As illustrated in FIGS. 1–7, released microstructure 50 may be created depending on the patterning of the hard masks used in the above-described process. Such released microstructures may be used in microdevices such as microstructured hinges, valves, gears, beams, proof masses and the likes.

FIGS. 8–13 illustrate a process in accordance with another exemplary embodiment of the invention for forming a freed microstructure from a substrate using ion implantation. The process starts by providing a monocrystalline semiconductor substrate such as substrate 10 described above with reference to FIG. 1. A first hard mask 60 is deposited overlying substrate 10 using standard techniques known in the semiconductor industry. First hard mask 60 may comprise any of the materials of which hard mask 20 described above with reference to FIG. 1 is comprised.

Figure 9A:
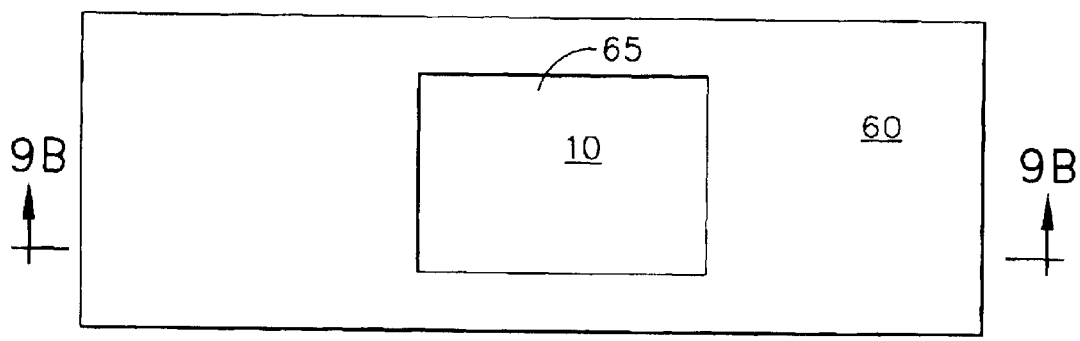
Figure 9B:
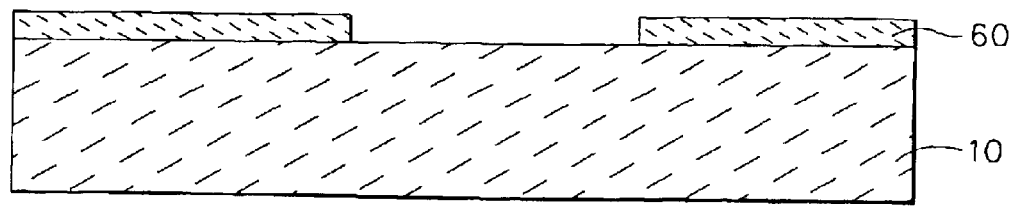

Referring to FIGS. 9A and 9B, first hard mask 60 is then patterned using standard semiconductor photolithography techniques to expose a first portion 65 of substrate 10 suitable for subsequently forming a freed microstructure, as described in more detail below.

Figure 10:
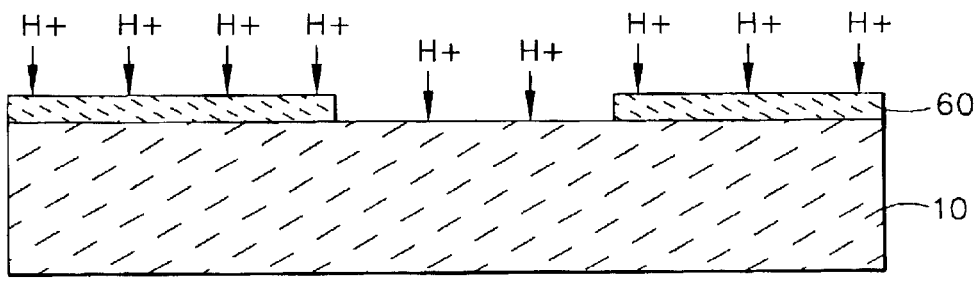
Figure 11:
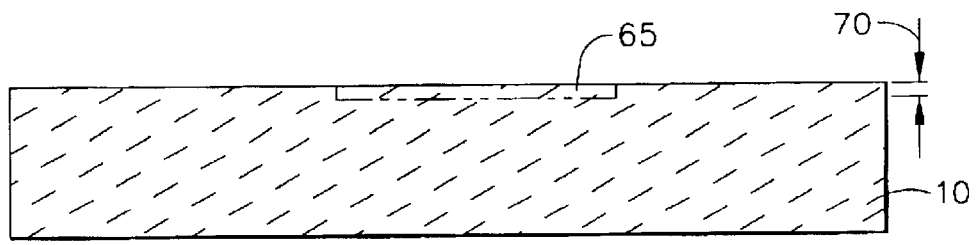

Referring to FIG. 10, substrate 10 then is subjected to an ion bombardment of H+ ions at a given dose and energy to effect implantation to a desired penetration depth 70, as shown in FIG. 11. The penetration depth may determine the thickness of the microstructure that will be freed from substrate 10 or, alternatively, a surface of the microstructure that will be separated from substrate 10 upon thermal treatment. The implantation of the H+ ions may be conducted at the doses and energies described above with reference to FIGS. 3 and 4. As illustrated in FIG. 11, first hard mask 60 is then removed.

Figure 12A:
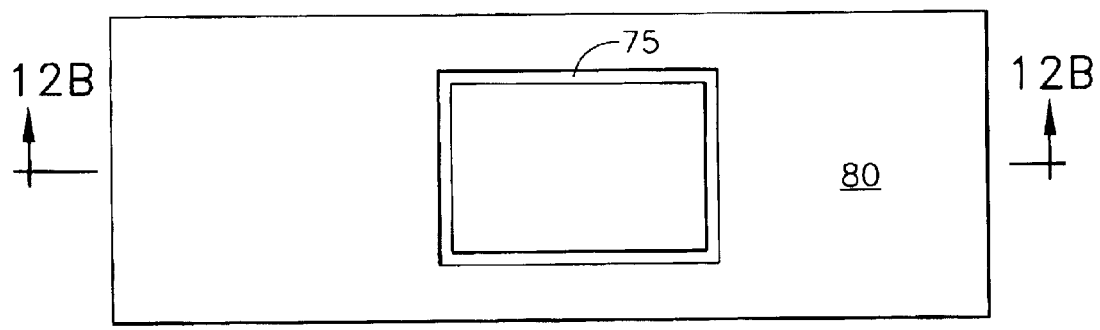
Figure 12B:
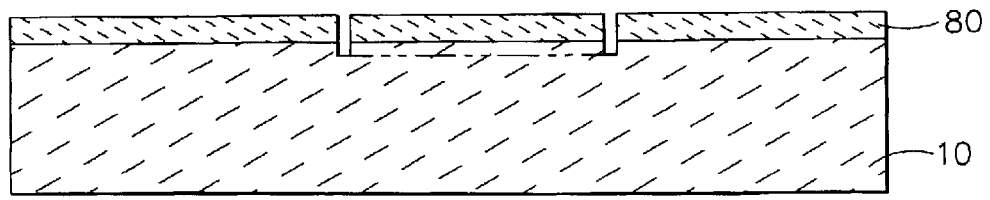

Referring to FIGS. 12A and 12B, a second hard mask 80 is deposited overlying substrate 10 and is patterned using standard semiconductor photolithography techniques to expose a second portion 75 of substrate 10 which has been subjected to ion implantation. In one exemplary embodiment of the present invention, second hard mask 80 is patterned to expose substrate 10 about the edges of first portion 65 of substrate 10 exposed to ion implantation. Alternatively, second hard mask 80 may be patterned to expose an area of substrate 10 proximate to first portion 65 of substrate 10 subject to ion bombardment so that subsequent etching serves to separate first portion 65 of substrate 10 subjected to ion bombardment from the remainder of substrate 10 at the side edges. In this manner, second hard mask 80 may be suitably patterned so that a freed microstructure may be subsequently fabricated, as discussed in more detail below. Substrate 10 is then subjected to an etch to a depth of the substrate at least as great as desired penetration depth 70.

Figure 13:
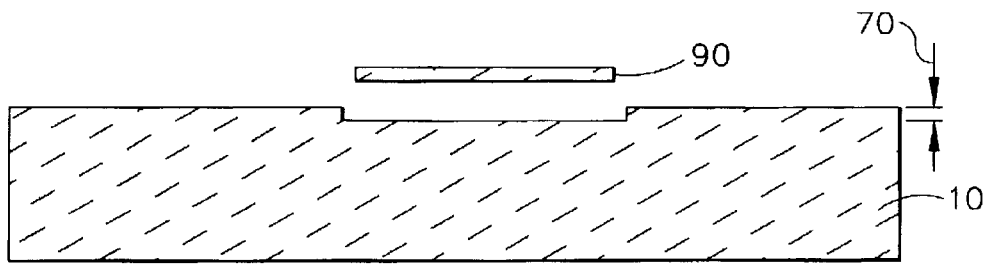

Referring to FIG. 13, substrate 10 is then thermally treated to induce a freed microstructure 90 to separate or cleave from substrate 10 at the penetration depth 70. The thermal treatment described above with reference to FIG. 7 may be used to produce freed microstructure 90. Again, microstructure 90, formed from substrate 10, has the same single crystal lattice as that of substrate 10.

While in the above embodiment, second hard mask 80 is removed prior to thermal treatment, it will be appreciated that substrate 10 may be thermally treated before hard mask 80 is removed.

Figure 14:
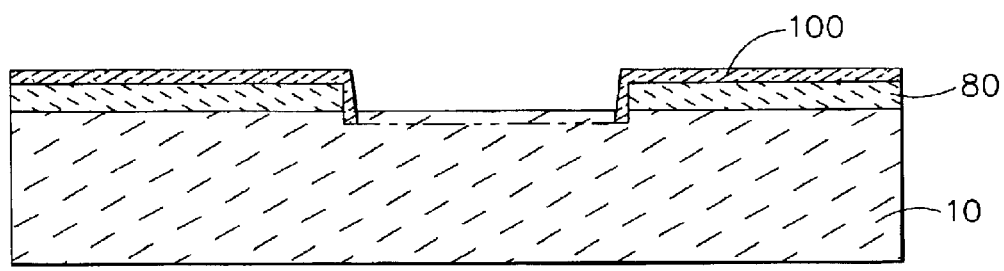
FIGS. 14–17 illustrate schematically, in cross section, the formation of a freed, entrapped microstructure in accordance with an exemplary embodiment of the invention.
Figure 15:
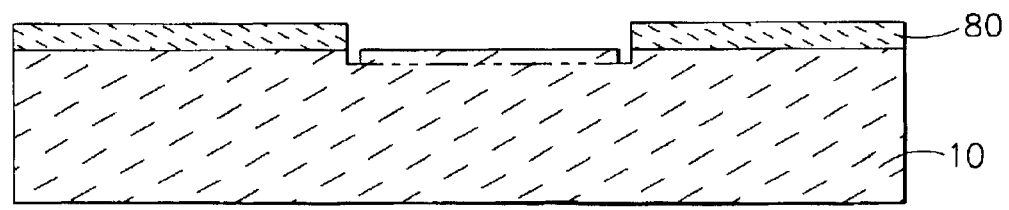

In yet another exemplary embodiment of the invention, the above described process may be used to form freed, entrapped microstructures. Such microstructures may be used to fabricate a variety of devices, such as, for example, microvalves and the like. In this exemplary embodiment of the invention, the procedures described above with respect to FIGS. 8–12B may be completed. Following the etching of substrate 10 as described with reference to FIGS. 12A and 12B, a photoresist 100 is applied to the substrate and patterned using standard photolithography techniques known in the semiconductor industry to expose unwanted hard mask. The exposed unwanted hard mask is then removed from substrate 10, as illustrated in FIG. 14. Referring to FIG. 15, the photoresist is then removed from substrate 10.

In an alternative embodiment (not shown), after etching, second hard mask 80 may be removed from substrate 10 and an intermediate layer can be formed overlying substrate 10. The area of substrate 10 that was not subjected to ion bombardment then may be masked, and the intermediate layer overlying the area of substrate 10 that was subjected to ion bombardment can be removed. The mask can then be removed, forming a structure similar to that illustrated in FIG. 15 except that an intermediate layer is formed where second hard mask 80 is shown. The intermediate layer may comprise any material of which second hard mask 80 is formed or any other material suitable forming a freed, entrapped microstructure.

Figure 16:
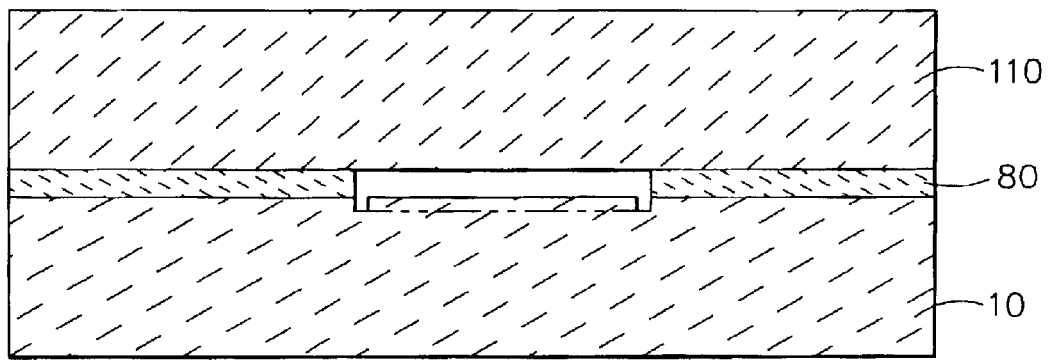

Turning now to FIG. 16, a second material layer 110 is then bonded to second hard mask 80 (or an intermediate layer, as described above). The second material layer may include a wafer formed of silicon or germanium or a mixture of silicon and germanium, other epitaxial material layers, or any other material layer suitable for bonding to substrate 10. In one exemplary embodiment of the present invention, second material layer 110 is fusion bonded to second hard mask 80. In a preferred embodiment, the second material layer 110 is fusion bonded to second hard mask 80 by thermal treatment at a temperature in the range of about 600° C. to 1200° C. for about 1 to 5 hours. In a more preferred embodiment, the second material layer 110 is fusion bonded to second hard mask 80 by creating a vacuum of about $1 \cdot 10^{-3}$ mbar, applying a force of about 1000 Newtons for about 30 seconds in nitrogen, and annealing at a temperature of about 800° C. for about 3 hours in nitrogen.

Figure 17:
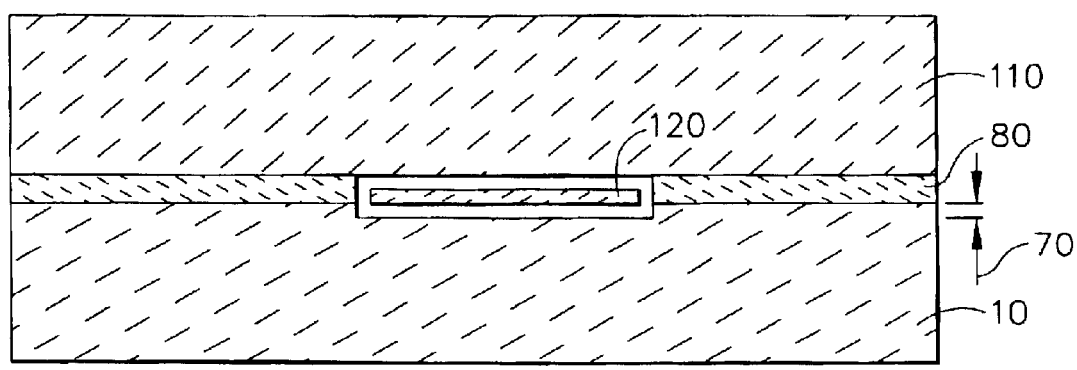

If a high temperature bonding procedure such as that described above is used to bond second material layer 110 to second hard mask 80, the high temperature bonding may also result in a freed, entrapped microstructure 120 separating or cleaving from substrate 10 at the penetration depth 70, as illustrated in FIG. 17. Alternatively, after bonding second material layer 110 to substrate 10, substrate 10 may be thermally treated to induce a freed, entrapped microstructure 120 to separate or cleave from substrate 10 at the penetration depth 70. The thermal treatment described above with reference to FIG. 7 may be used to produce freed, entrapped microstructure 120.

Again, freed, entrapped microstructure 120, formed from substrate 10, has the same single crystal lattice as that of substrate 10. Thus, by way of example, substrate 10 may be formed of a relatively defect-free monocrystalline silicon, second material layer 110 may be formed of a relatively defect-free monocrystalline silicon and freed, entrapped microstructure 120 likewise will be formed of relatively defect-free monocrystalline silicon.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential features or elements of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a microstructure from a substrate, the method comprising:
   providing a monocrystalline substrate having a (100) orientation;
   subjecting a first portion of said substrate to ion bombardment to effect ion implantation to a desired penetration depth;
   etching a second portion of said substrate to a depth at least as great as said desired penetration depth; and
   thermally treating said substrate to form a microstructure at a first surface of said substrate and to effect at least partial separation between said microstructure and said substrate.

2. The method of claim 1, said second portion of said substrate comprising at least a part of said first portion of said substrate.

3. The method of claim 1, further comprising forming a first patterned hard mask on said substrate prior to said subjecting.

4. The method of claim 3, said first patterned hard mask comprising one of silicon dioxide, silicon nitride and metal.

5. The method of claim 3, further comprising removing said first patterned hard mask after said subjecting.

6. The method of claim 5, further comprising forming a second patterned hard mask on said substrate prior to said etching.

7. The method of claim 6, further comprising removing said second patterned hard mask after said etching.

8. The method of claim 6, said second patterned hard mask comprising one of silicon dioxide, silicon nitride and metal.

9. The method of claim 6, further comprising:
   removing said second patterned hard mask from said first portion of said substrate; and
   bonding a material layer to said second patterned hard mask before said thermal treating.

10. The method of claim 6, further comprising, after said etching and before said thermally treating:
    removing said second patterned hard mask;
    forming a first material layer overlying said substrate except said first portion of said substrate; and
    bonding a second material layer to said first material layer.

11. The method of claim 1, said substrate comprising at least one of monocrystalline silicon and monocrystalline germanium.

12. The method of claim 1, said subjecting comprising subjecting said substrate to ion bombardment at an ion dose of from about $1 \cdot 10^{16}$ cm$^{-2}$ to about $7 \cdot 10^{16}$ cm$^{-2}$.

13. The method of claim 1, said subjecting comprising subjecting said substrate to ion bombardment at an energy of from about 40 keV to about 80 keV.

14. The method of claim 1, said thermally treating comprising heating said substrate to a temperature of from about 400° C. to about 600° C.

15. A method for forming a monocrystalline structure from the surface of a monocrystalline substrate, the method comprising:

providing a monocrystalline substrate having a (100) orientation;

forming a first patterned hard mask on said substrate to expose a first portion of said substrate;

subjecting said first portion of said substrate to ion bombardment to effect ion implantation to a desired penetration depth;

removing said first patterned hard mask;

forming a second patterned hard mask on said substrate to expose a second portion of said substrate;

etching said second portion of said substrate to a depth at least as great as said desired penetration depth; and thermally treating said substrate to form a microstructure at a surface of said substrate and to effect at least partial separation between said microstructure and said substrate.

16. The method of claim 15, further comprising removing said second patterned hard mask before said thermally treating.

17. The method of claim 15, said second portion of said substrate comprising at least a part of said first portion of said substrate.

18. The method of claim 15, further comprising bonding a material layer to said second patterned hard mask before said thermally treating.

19. The method of claim 15, further comprising, after said etching and before said thermally treating:

removing said second patterned hard mask before said thermally treating;

forming a first material layer overlying said substrate except said first portion of said substrate; and bonding a second material layer to said first material layer.

* * * * *